(12) United States Patent
Kim

(10) Patent No.: US 6,660,555 B2
(45) Date of Patent: Dec. 9, 2003

(54) X-RAY IMAGE SENSOR AND METHOD FOR FABRICATING THE SAME

(75) Inventor: Jong-Sung Kim, Kyonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 9 days.

(21) Appl. No.: 10/067,846

(22) Filed: Feb. 8, 2002

(65) Prior Publication Data

US 2002/0117668 A1 Aug. 29, 2002

Related U.S. Application Data

(62) Division of application No. 09/722,654, filed on Nov. 28, 2000, now Pat. No. 6,399,962.

(30) Foreign Application Priority Data

Nov. 30, 1999 (KR) .......................................... 1999-53712

(51) Int. Cl.[7] .................... H01L 29/04; H01L 31/036; H01L 31/0376; H01L 31/20
(52) U.S. Cl. ................ 438/57; 438/65; 438/98
(58) Field of Search ................ 438/57, 65, 98

(56) References Cited

U.S. PATENT DOCUMENTS 5,693,567 A * 12/1997 Weisfield et al. ........... 438/648
5,923,390 A * 7/1999 Mok et al. .................... 349/38
6,277,679 B1   8/2001 Ohtani

FOREIGN PATENT DOCUMENTS

JP        10163463 A2    6/1998

* cited by examiner

*Primary Examiner*—Olik Chaudhuri
*Assistant Examiner*—William M. Brewster
(74) *Attorney, Agent, or Firm*—McKenna Long & Aldridge LLP

(57) ABSTRACT

An X-ray image sensor having a photoelectric conversion part that converts X-ray photons into electric charges. The X-ray image sensor includes a pixel electrode for collecting the electric charges and a storage capacitor for storing the electric charges collected by the pixel electrode. The storage capacitor includes a first capacitor electrode, the pixel electrode, and a dielectric layer that is deposited on the first capacitor electrode. The pixel electrode contacts an electron transport electrode via a hole through the dielectric layer. A switching TFT controls the release of electric charges in the storage capacitor to an external circuit. The switching TFT is comprised of a gate electrode, a first insulation film, a drain electrode, and a source electrode that contacts the electron transport electrode.

8 Claims, 6 Drawing Sheets

X-RAY IMAGE SENSOR AND METHOD FOR FABRICATING THE SAME

This application is a Division of application Ser. No. 09/722,654 Filed on Nov. 28, 2000 U.S. Pat. No. 6,399,962.

This application claims the benefit of Korean Patent Application No. 1999-53712, filed on Nov. 30, 2000, which is hereby incorporated by reference for all purposes as if fully set forth herein.

BACKGROUND OF THE INVENTION

1. Field of the Invention

The present invention relates to X-ray image sensors. More particularly, it relates to X-ray image sensors having a TFT (Thin Film Transistor) array, and to a method for fabricating the same.

2. Discussion of the Related Art

X-ray detection has been widely used for medical diagnosis. X-ray detection typically uses an X-ray film to produce a photograph. Therefore, some predetermined developing and printing procedures are required to produce the photograph.

However, digital X-ray image sensors that employ TFTs (Thin Film Transistors) have been developed. Such X-ray image sensors have the advantage that real time diagnosis can be obtained.

FIG. 1 is a schematic, cross-sectional view illustrating the structure and operation of an X-ray image sensing device 100. Included are a lower substrate 1, a thin film transistor 3, a storage capacitor 10, a pixel electrode 12, a photoconductive film 2, a protection film 20, a conductive electrode 24 and a high voltage D.C. (direct current) power supply 26.

The photoconductive film 2 produces electron-hole pairs in proportion to the strength of external signals (such as incident electromagnetic waves or magnetic waves). That is, the photoconductive film 2 acts as a converter that converts external signals, particularly X-rays, into electric signals. Either the electrons or the holes are then gathered by the pixel electrode 12 as charges. The pixel electrode is located beneath the photoconductive film 2. Which charge species that is gathered depends on the voltage (Ev) polarity that is applied to the conductive electrode 24 by the high voltage D.C. power supply 26. The gathered species charges are accumulated in the storage capacitor 10, which is formed in connection with a grounding line. Charges in the storage capacitor 10 are then selectively transferred through the TFT 3, which is controlled externally, to an external image display device that forms an X-ray image.

In such an X-ray image sensing device, to detect and convert weak X-ray signals into electric charges it is beneficial to decrease the trap state density (for the electric charge) in the photoconductive film 2, and to decrease charge flow in non-vertical directions. Decreasing non-vertical charge flow is usually accomplished by applying a relatively high voltage between the conductive electrode 24 and the pixel electrode 12.

Electric charges in the photoconductive film 2 are trapped and gathered not only on the pixel electrode 12, but also over the channel region of the TFT 3. Even during the OFF state, the electric charges trapped and gathered on the pixel electrode 12 and on the channel region of the TFT 3 induce a potential difference between the TFT 3 and the pixel electrode. This has a similar effect as the TFT 3 being in the ON state. This adversely affects the switching of the TFT 3 and increases the OFF state leakage current. Such can result in an undesired image.

FIG. 2 is a plan view illustrating one pixel 102 of the X-ray image sensor panel 100. Shown are the TFT 3, a storage capacitor "S" and a pixel electrode 62 that collects charges.

The TFT 3 includes a gate electrode 31, which is formed by an elongation of a gate line 50, and a drain electrode 32, which is formed by an elongation of a drain line 52.

The storage capacitor "S" is comprised of transparent first and second capacitor electrodes 58 and 60. A ground line 42 acts as a common electrode that is shared by adjacent pixels. Also shown are first contact holes 54 that connects the pixel electrode 62 with a source electrode 33 of the TFT 3, and a second contact hole 56 that connects the pixel electrode 62 with the second capacitor electrode 60.

According to the conventional art, an X-ray image sensor includes a photoelectric conversion part that produces electric charges in accordance with received electromagnetic energy; a charge storage capacitor "S" having a first capacitor electrode 58, a dielectric layer that is deposited on the first capacitor electrode 58, a second capacitor electrode 60 on the dielectric layer, a protection film having multiple contact hole(s) 54 and 56 on the second capacitor electrode 60, and a pixel electrode 62 that is formed on the protection film. The pixel electrode is in contact with the second capacitor electrode 60 through the contact hole(s) 56 and collects the electric charges produced in the photoelectric conversion part. A switching TFT 3 controls the release of the electric charges stored in the storage capacitor "S". The switching TFT includes a gate electrode 31, a drain electrode 32, and a source electrode 33 that contacts the pixel electrode 62.

FIGS. 3a to 3f are sectional views, taken along the line III—III of FIG. 2, that illustrate a manufacturing process.

Referring to FIG. 3a, a metal layer is deposited and patterned on a substrate 1 to form a taper-shaped gate electrode 31. The substrate 1 can be a quartz substrate or a glass substrate. However, the substrate 1 is beneficially a glass panel since quartz panels are relatively expensive. The gate electrode 31 can made of a metallic material selected from a group comprised of Molybdenum (Mo), Tantalum (Ta), Tungsten (W), Niobium (Nb), and Antimony (Sb).

FIG. 3b illustrates the steps of depositing a first insulation film 102 and a semiconductor layer 104. The gate insulation film 102 is formed by a deposition of an inorganic insulation film (such as a silicon nitride ($SiN_x$) film or a silicon oxide($SiO_x$) film) having 4000 Å thickness. Alternatively, an organic insulation material such as BCB (benzocyclobutene) or acrylic resin can be used. After the deposition of the first insulation film 102, a dual layer semiconductor film 104 comprised of an amorphous silicon layer 104a and a doped amorphous silicon film 104b are deposited. Although vapor deposition or ion injection can be used for the formation of the doped amorphous silicon film 104b, vapor deposition is usually employed.

Next, as shown FIG. 3c, a second metal layer is deposited for both the source electrode 33 and the drain electrode 32, and for the sound line 42. That metal, beneficially Chromium (Cr) or a Cr-alloy, is then patterned to form the source electrode 33, the drain electrode 32 and the ground line 42. Moreover, the portion of the doped amorphous silicon film 104b between the source and drain electrodes 33 and 32 is eliminated by using the source and drain electrodes as masks. Then, a first capacitor electrode 58 is formed over the ground line 42. The first capacitor electrode 58 is beneficially comprised of a transparent electrode material such as ITO (indium tin oxide). The region C in FIG. 3c designates a switching transistor.

Referring to FIG. 3d, a silicon nitride film having a thickness of 3000 Å forms a second insulation film 106 is deposited on the source and drain electrodes 33 and 32, and on the first capacitor electrode 58. The second insulating film 106 acts as protective layer for the TFT 3 and as a dielectric for a capacitor that is being formed with the first capacitor electrode 58.

After the second insulation film 106 is deposited a second capacitor electrode 60 is formed on the second insulation film 105 and over the first capacitor electrode 58. Beneficially, the second capacitor electrode is the same size as or a little larger than the first capacitor electrode 58.

As shown in FIG. 3e, an insulating protection film 108 is then formed. An organic substance such as BCB (benzocyclobutene) is beneficially used. BCB is a material that has a lower dielectric constant than silicon nitride, silicon oxide or acrylic resin. After formation of the protection film 108, first and second contact holes 54 and 56 are formed through the protection film 108. The first contact hole 54 exposes a portion of the source electrode 33. The second contact hole 56 exposes a portion of the second capacitor electrode 60. Although the first contact hole 54 penetrates down to the source electrode 33, the second contact hole 56 can not go as deep since the second capacitor electrode 60 acts as an etch stop that prevents the second insulation film 106 from being etched.

FIG. 3f illustrates the step of forming a pixel electrode 62 (a third transparent electrode layer). The pixel electrode is formed over the second insulation film 106 such that the pixel electrode extends into the first and second contact holes 54 and 56 and electrically connects with the source electrode and the second capacitor electrode 60. In addition, the pixel electrode 62 is formed such that it extends over the TFT 3.

The next step is the application of a light-sensitive material 123. That material converts received external signals (X-rays) into electric charges. The light-sensitive material 123 is beneficially comprised of an amorphous selenium compound that is deposited in a thickness of 100 to 500 $\mu$m by an evaporator. However, other X-ray-sensitive materials that having low dark conductivity and high sensitivity to external signals, for example $HgI_2$, $PbO_2$, CdTe, CdSe Thallium bromide or cadmium sulfide can also be used. When the light-sensitive material is exposed to X-rays, electron-hole pairs are produced in the light-sensitive material in accordance with the strength of the x-rays.

After the application of the X-ray-sensitive material, a transparent conductive electrode 133 that passes X-ray is formed. When a voltage is applied to the transparent conductive electrode 133 while X-rays are being irradiated electron-hole pairs formed in the light-sensitive material are separated into charges that are gathered to the pixel electrode 62 and stored in the storage capacitor "S".

According to the mentioned conventional X-ray image sensing device, however, the depositing and patterning of the electrodes are performed three times to fabricating the storage capacitor "S". Moreover, the gate line, and the source and drain electrode are overetched while etching the ITO layers.

Moreover, as shown FIG. 4, due to the shortness of the length "$\Delta L$" between the first capacitor electrode 58 and the source electrode 33, a short-circuit can result.

Furthermore, a parasitic capacitor between the drain line 52 and the first capacitor electrode 58 can cause problems.

The present invention has been developed as a result of continuous effort by the inventors to solve the above-described problems.

SUMMARY OF THE INVENTION

Accordingly, the present invention is directed to an x-ray image sensor and to a method for fabricating the same and that substantially obviates one or more of the problems due to limitations and disadvantages of the related art.

An object of the present invention is to provide an X-ray image sensor having simpler processing steps while forming ITO (indium tin oxide) electrodes.

Another object of the present invention is to provide an X-ray image sensor having improved yields.

A further object of the invention is to provide a method of forming an X-ray image sensor which can reduce processing error during production by preventing short-circuits and which can decrease noise due to a parasitic capacitor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve the above objects, the present invention provides an X-ray image sensor, including: a substrate; a gate electrode on the substrate; a first insulation fill on the substrate that covers the gate electrode; a semiconductor film of amorphous silicon film on the first insulation film over the gate electrode; a doped amorphous silicon film on the semiconductor film; source and drain electrodes on the doped amorphous silicon film that are spaced apart from each other; a ground line on the first insulation film that is spaced apart from the source and gate electrodes; a second insulation film covering the whole substrate and having first and second contact holes that expose portions of the ground line and the source electrode, respectively; a first capacitor electrode on the second insulation film, the first capacitor electrode having an electrical connection with the ground line through the first contact hole; an electron transport electrode on the second insulation film, the electron transport electrode having an electrical connection with the source electrode through the second contact hole; a dielectric layer covering the second insulation film, the first capacitor electrode and the electron transport electrode, the dielectric layer having a third contact hole; and a pixel electrode on the dielectric layer having an electrical connection with the electron transport electrode.

Beneficially, the pixel electrode extends over the semiconductor film, and the insulation layers are made of a material selected from the group consisting of BCB (benzocyclobutene), acryl and polyamide. Moreover, the X-ray image sensor includes a light-sensitive material on the pixel electrode.

In order to achieve the above objects, the invention also provides a method for fabricating an X-ray image sensor including: providing a substrate; forming a gate electrode on the substrate; forming a first insulation film on the substrate and that covers the gate electrode; forming a semiconductor film of amorphous silicon film on the first insulation film over the gate electrode; forming a doped amorphous silicon film on the semiconductor film; forming source and drain electrodes on the doped amorphous silicon film that are spaced apart from each other, forming a channel region by eliminating the doped amorphous silicon film between the source and drain electrodes by using the source and drain electrodes as a mask; forming a ground line on the first insulation film that is spaced apart from the source and gate electrodes; forming a second insulation film covering the whole substrate; forming first and second contact holes that expose a portion of the ground line and a portion of the source electrode, respectively; forming a first capacitor electrode on the second insulation film, the first capacitor electrode having an electrical connection with the ground line through the first contact hole; forming an electron transport electrode on the second insulation film, the electron transport electrode having an electrical connection with the source electrode through the second contact hole; forming a dielectric layer that covers the second insulation film, the first capacitor electrode and the electron transport electrode; forming a third contact hole in the dielectric layer; forming a pixel electron on the dielectric layer, the pixel electrode having an electrical connection with the electron transport electrode; forming a light-sensitive material on the pixel electrode; and forming a transparent conductive electrode that passes X-rays on the light-sensitive material.

The insulation layers are beneficially made of a material selected from the group consisting of BCB (benzocyclobutene), acryl and polyamide. The capacitor electrode and the pixel electrode are beneficially made of transparent ITO (indium tin oxide). The X-ray-sensitive material is beneficially one of a group consisting of $HgI_2$, $PbO_2$, CdTe, CdSe, Thallium Bromide, and Cadmium Sulfide etc.

It is to be understood that both toe foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF AN ILLUSTRATED EMBODIMENT

Reference will now be made in detail to an illustrated embodiment of the present invention, the example of which is shown in the accompanying drawings.

According to the present invention, an X-ray image sensor comprises a photoelectric conversion part that produces electric charges in accordance with the received amount of light; a charge storage capacitor having a second insulation film with a plurality of contact holes for a first capacitor electrode, the first capacitor electrode and an electron transport electrode on the second insulation film, a dielectric layer deposited on the first capacitor and electron transport electrodes, and a pixel electrode formed on the dielectric layer in contact with the electron transport electrode through a contact hole, the electron transport electrode for collecting the electric charges produced in the photoelectric conversion part; and a switching TFT that controls the release of electric charges stored in the storage capacitor.

The switching TFT is comprised of a gate electrode, a first insulation film, a drain electrode, and a source electrode that contacts the electron transport electrode.

FIGS. 5a to 5e are diagrams that help illustrate the process of manufacturing an X-ray image sensor according to the principles of the present invention. Such an X-ray image sensor uses only two electrodes for a storage capacitor.

Figure 1:
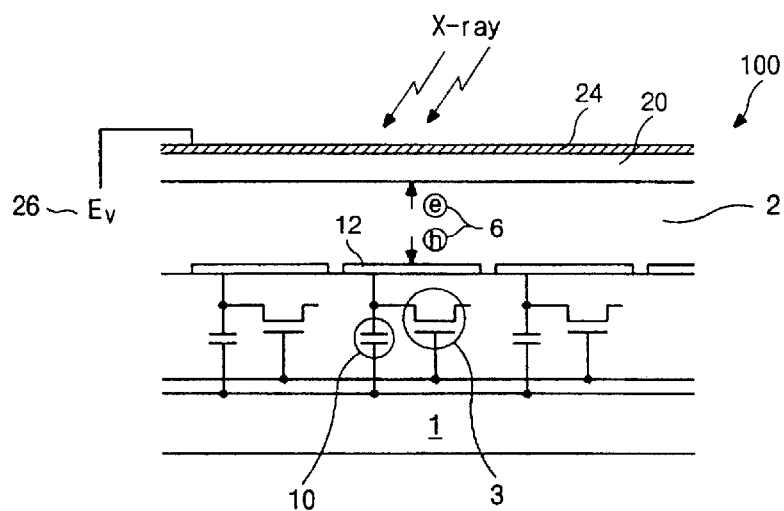
FIG. 1 is a cross-sectional view illustrating the principle of operation of an X-ray image sensor.
Figure 2:
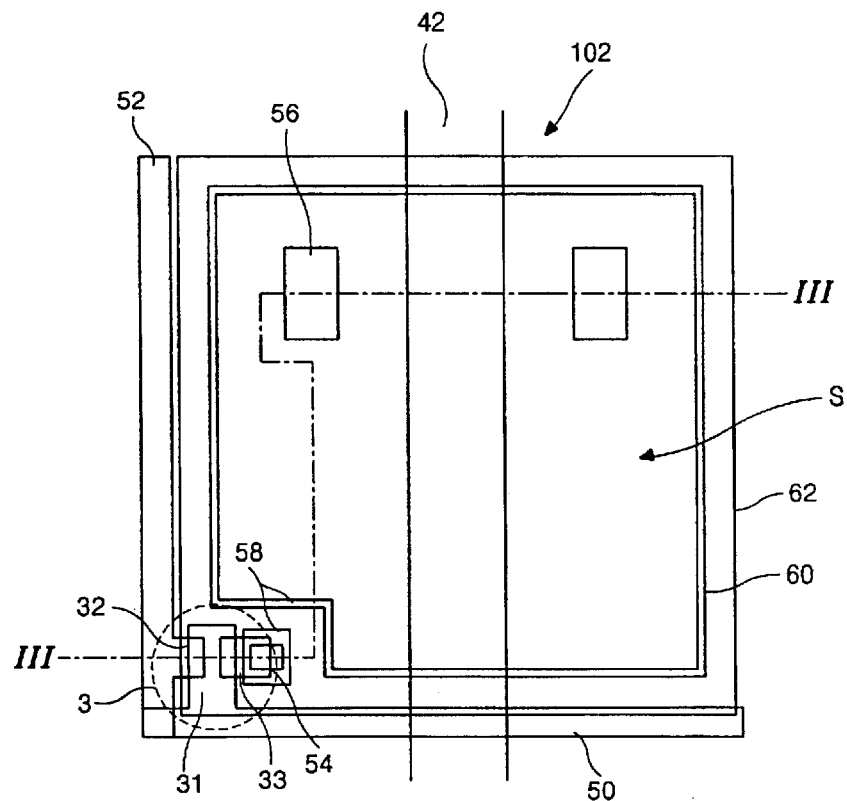
FIG. 2 is a plan view illustrating one pixel of an X-ray image sensor according to a conventional art.
Figure 3A:
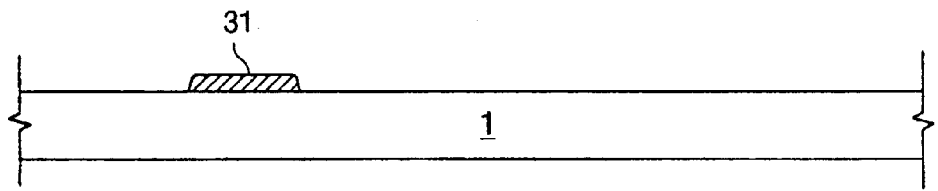
FIGS. 3a to 3f are processing diagrams corresponding to a cross-section of FIG. 2 (III—III) and sequentially illustrate the manufacture of an X-ray image sensor according to the conventional art.
Figure 3B:
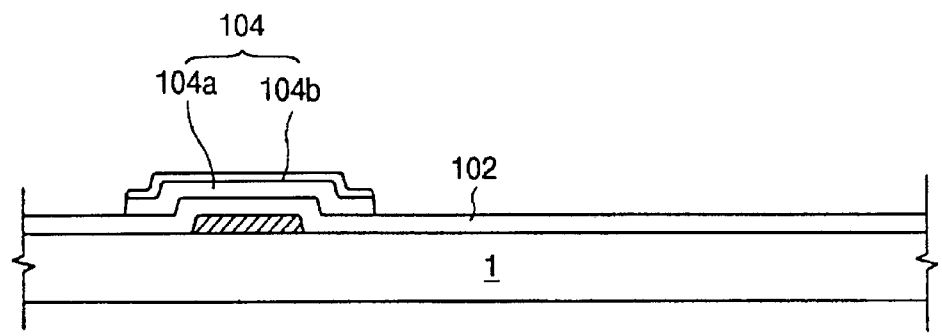
Figure 3C:
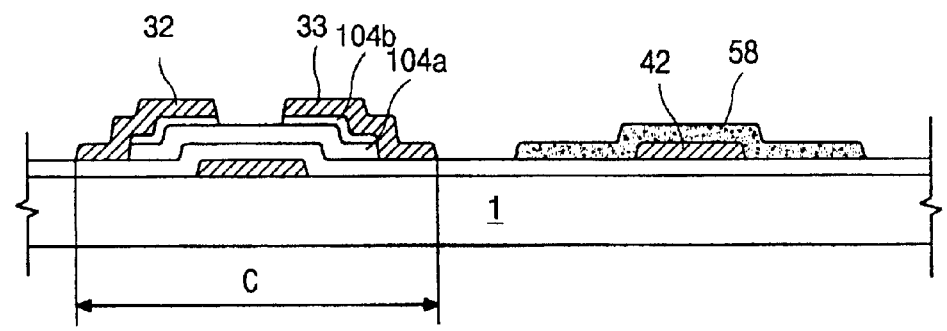
Figure 3D:
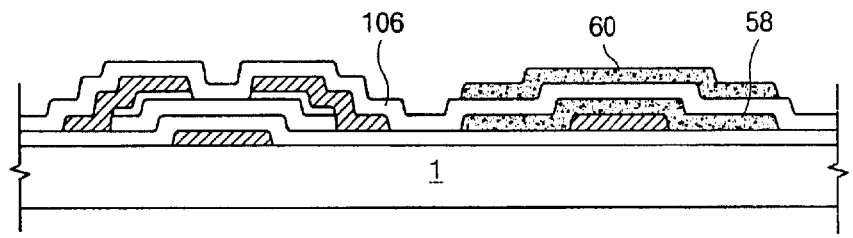
Figure 3E:
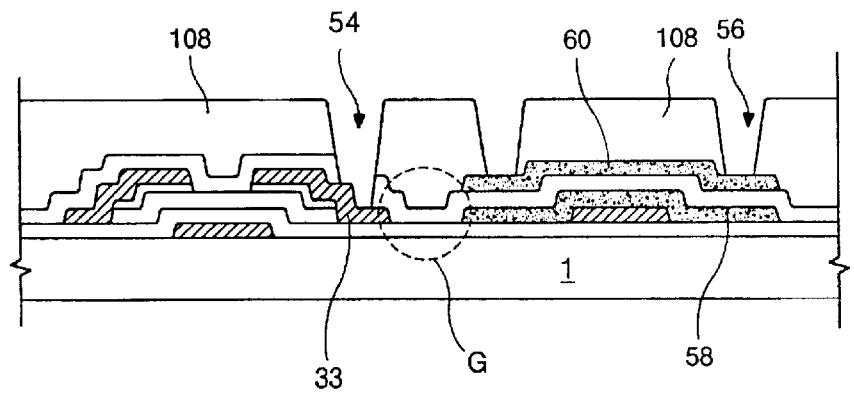
Figure 3F:
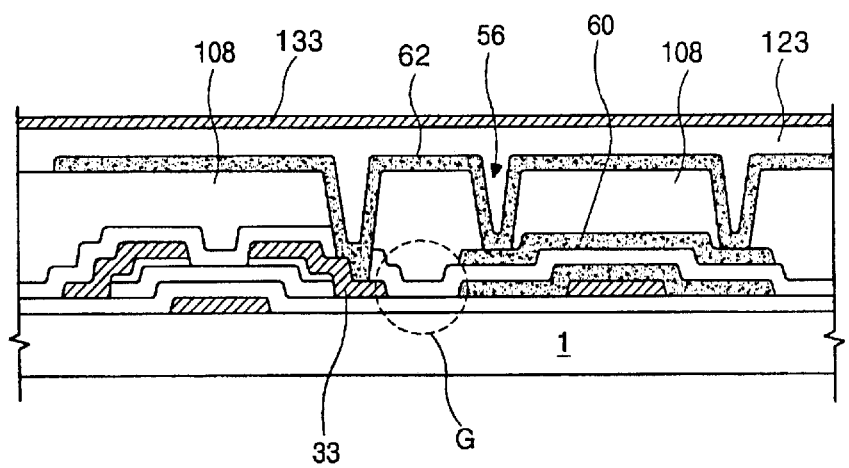
Figure 4:
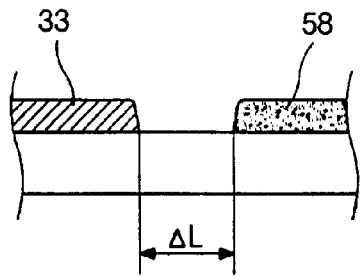
FIG. 4 is an enlarged cross-sectional view illustrating a portion "G" of FIG. 3f.
Figure 5A:
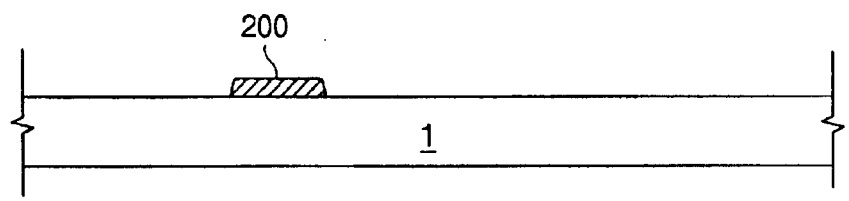
FIGS. 5a to 5f are processing diagrams illustrating the manufacture of an X-ray image sensor according to the present invention.

Referring to FIG. 5a, an opaque first metal layer is deposited on a substrate 1. The first metal layer is then patterned to form a gate electrode 200.

Figure 5B:
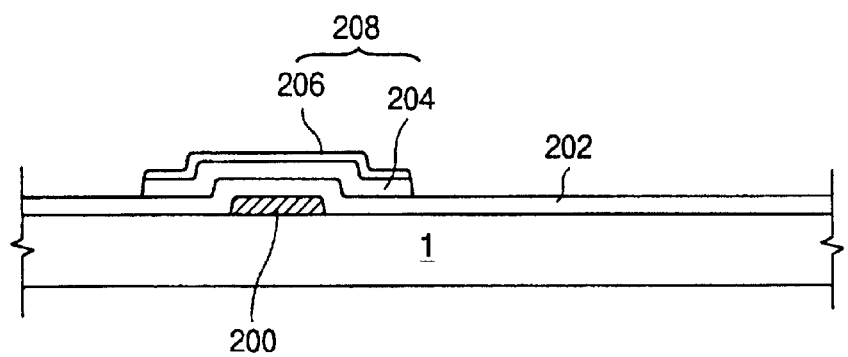

FIG. 5b is a cross-sectional view illustrating the depositing of a first insulation film 202 and of a semiconductor layer 208. The (gate insulating) first insulation film 202 is formed over the substrate by deposition. Then, a dual layer semiconductor film 208 comprised of a pure amorphous silicon film 204 and of a doped amorphous silicon film 206 is deposited and patterned. The semiconductor film 203 can also be made of polycrystalline silicon.

Figure 5C:
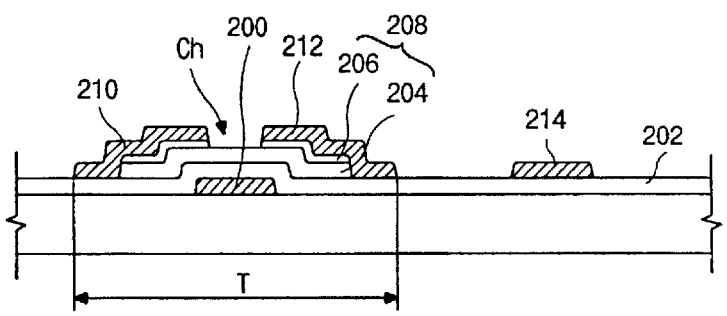

As shown in FIG. 5c, the next step is the formation of a second metal layer for source and drain electrodes 212 and 210, and for a ground line 214. The second metal layer is deposited on the semiconductor layer 208 and on the first insulation layer 202. Then, the source and drain electrodes 212 and 210 are formed such that they are spaced apart by patterning the second metal layer on the semiconductor layer 208. The ground line 214 is also formed on the first insulation film 202, again by patterning the second metal layer.

After that, a portion of the doped amorphous silicon film 206 between the source an drain electrodes 212 and 210 is eliminated by using the source and drain electrodes 212 and 210 as masks. This defines a channel region "Ch". The thin film transistor (TFT) "T" is this completed. In operation the ground line 214 removes residual charge in a storage capacitor that is being formed.

Figure 5D:
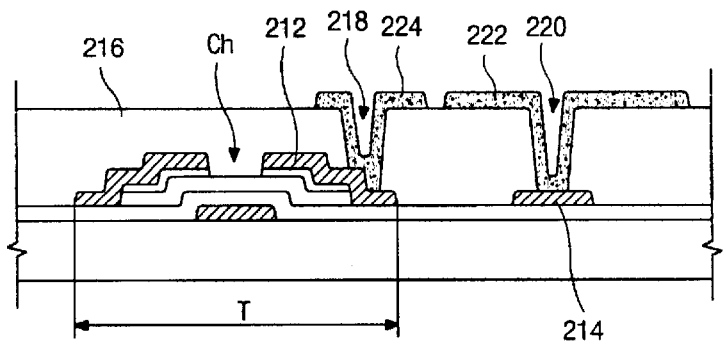

FIG. 5d is a cross-sectional view illustrating the fabrication step of a first capacitor electrode 222 and of an electron transport electrode 224.

A second insulation film 216 that acts as a protection film is formed over the TFT an the ground line 214. After the formation of the second insulation film 216, first and second contact holes 220 and 218 are formed through the second insulation film. The first contact hole 220 exposes a portion of the ground line 214, while the second contact hole 218 exposes a portion of the source electrode 212.

Then, a first capacitor electrode 222 and an electron transport electrode 224 are formed on the second insulation film. The electron transport electrode 224 is formed such that it electrically contacts the source electrode 212, while the first capacitor electrode 222 is formed such that it electrically contacts the ground line 214.

Organic BCB (benzocyclobutene), which is transparent material, is beneficially used for the second insulation film 216. BCB is a material having a dielectric constant less than 3, and a superior planarizing ratio that results in a flat surface. An acryl or a polyamide can also be employed as the second insulation film 216.

Figure 5E:
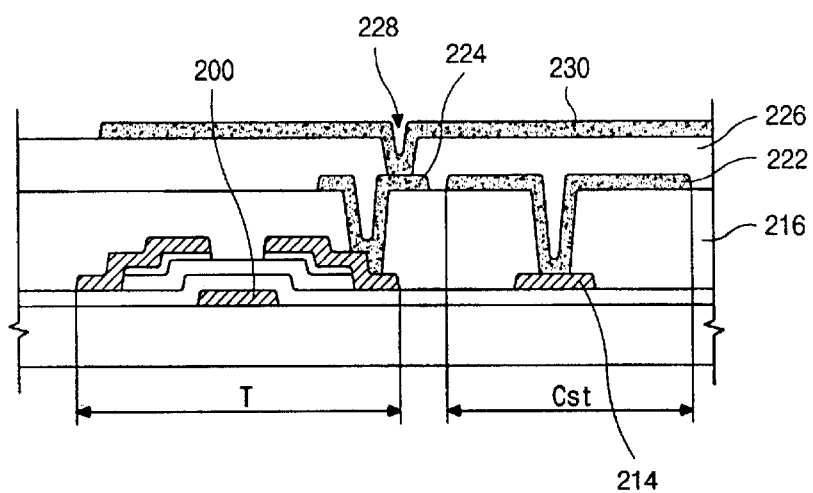

Referring to FIG. 5e, a dielectric layer 226 is then formed over the second insulation film, over the first capacitor electrode 222, and over the electron transport electrode 224. Then, a third contact hole 228 is formed through the dielectric 226 such that a portion of the electron transport electrode 224 is exposed. Then, a pixel electrode 230 (alternatively referred to as a second capacitor electrode 230) is formed on the dielectric layer 226. Moreover, the pixel electrode 230 is formed such that it has an electrical connection with the electron transport electrode 224. As the pixel electrode acts as second capacitor electrode, the storage capacitor "Cst" is completed. The storage capacitor "Cst" is comprised of the first capacitor electrode 222, the pixel electrode 230, and the dielectric layer 226.

Figure 5F:
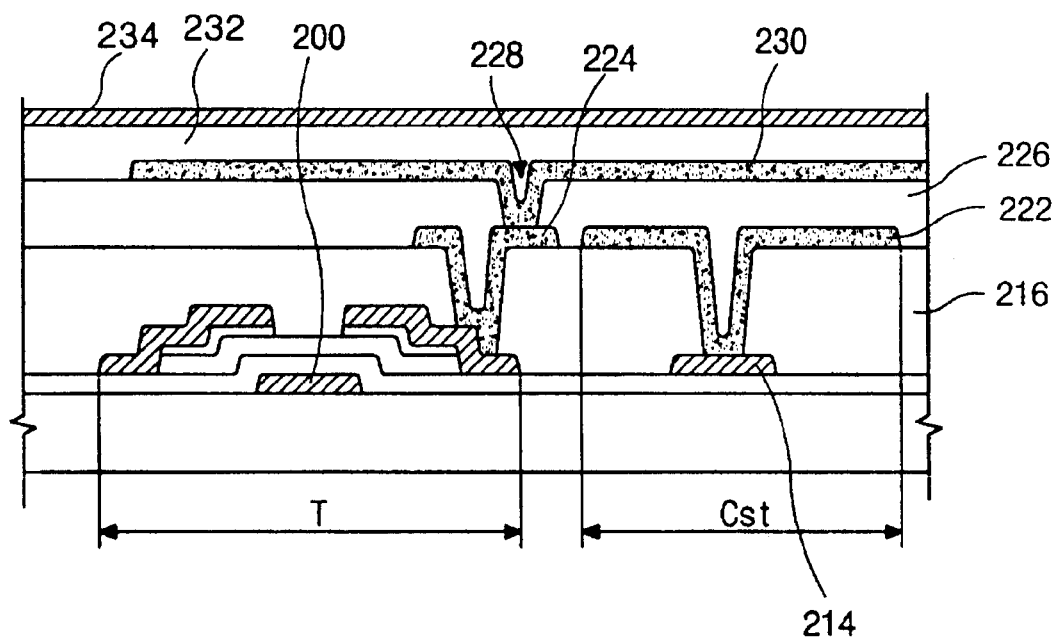

FIG. 5f illustrates a step of applying a light-sensitive material 232 that is used as a converter that converts an external signal (X-rays) into electron-hole pairs. Beneficially, the light-sensitive material 232 is an amorphous selenium compound that is deposited to a thickness of 100 to 500 μm by an evaporator. Alternatively, an X-ray-sensitive material having low dark conductivity and a high sensitivity to external signals, for example $HgI_2$, $PbO_2$, CdTe, CdSe, Thallium bromide, or Cadmium sulfide can also be used. When such a light-sensitive material is exposed to X-rays, electron-hole pairs are produced in the light-sensitive material in accordance with the strength of the irradiated light.

After the application of the light-sensitive material 232, a transparent conductive electrode 234 that transmits X-ray is formed over the light-sensitive material 232.

When a voltage is applied to the conductive electrode 234 while X-rays are being irradiated, electron-hole pairs are formed in the light-sensitive material. These pairs are separated into electrons and holes, one species of which is gathered to the pixel electrode 230 and stored as charge in the storage capacitor "Cst".

When the gate electrode turns the TFT ON, the stored electric charges are transferred to an external image display device (not shown) and are used to form an X-ray image.

After stopping the mentioned switching operation, the residual charges are transferred to the ground line 214. Therefore, the ground line 214 acts as the reset switch.

The present invention provides an X-ray image sensor having a simplicity of processing steps while forming ITO (indium tin oxide) electrodes. Moreover, the present invention provides a method of fabricating an X-ray image sensor that can have improved yields owing to a reduction in the processing steps.

Furthermore, the invention provides a more reliable X-ray image sensor having fewer short-circuits between the TFT electrodes and capacitor electrodes. Furthermore, the invention can reduce parasitic capacitances that affect the drain line. Therefore, noise can be decreased.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating an X-ray image sensor, comprising:

forming a gate electrode on a substrate;

forming a first insulation film over the substrate and the gate electrode;

forming an amorphous silicon film on the first insulation film and over the gate electrode;

forming a doped amorphous silicon film on the amorphous silicon film;

forming source and drain electrodes on the doped amorphous silicon film such that the source and drain electrodes are spaced apart from each other;

forming a channel region on the amorphous silicon layer by eliminating the doped amorphous silicon film between the source and drain electrodes;

forming a ground line on the first insulation film such that the ground line is spaced from the source and gate electrodes;

forming a second insulation film over the ground line, the channel region, the source and drain electrodes, and the first insulation film;

forming first and second contact holes through the second insulation film such that a portion of the ground line is exposed by the first contact hole and a portion of the source electrode is exposed by the second contact hole;

forming a first capacitor electrode on the second insulation film such that the first capacitor electrode is electrically connected to the ground line through the first contact hole;

forming an electron transport electrode on the second insulation film, the electron transport electrode having an electrical connection with the source electrode through the second contact hole;

forming a dielectric layer over the second insulation film, the first capacitor electrode and the electron transport electrode;

forming a third contact hole through the dielectric layer;

forming a second capacitor electrode on the dielectric layer such that the second capacitor electrode has an electrical connection with the electron transport electrode through the third contact hole;

forming a light-sensitive material on the pixel electrode; and forming an X-ray transparent conductive electrode on the light-sensitive material.

2. A method fabricating, an X-ray image sensor according to claim 1, wherein the first and second insulation layers are formed from a material selected from the group consisting of BCB (benzocyclobutene), acryl, and polyamide.

3. The method for fabricating an X-ray image sensor according to claim 1, wherein the first capacitor electrode and the second capacitor electrode are formed from indium.

4. A method for fabricating an X-ray image sensor according to claim 3, wherein the first capacitor electrode and the second capacitor electrode are formed from indium tin oxide.

5. A method for fabricating an X-ray image sensor according to claim 1, wherein the X-ray-sensitive material is formed from a material selected from the group consisting, of $HgI_2$, $PbO_2$, CdTe, CdSe, Thallium Bromide, and Cadmium Sulfide.

6. A method for fabricating an X-ray image sensor according to claim 1, wherein the X-ray-sensitive material is formed from amorphous selenium.

7. A method for fabricating an X-ray image sensor according to claim 6, wherein amorphous selenium is at least 100 μm thick.

8. A method for fabricating, an X-ray image sensor according to claim 7, wherein amorphous selenium is less than 500 μm thick.

* * * * *